(12) United States Patent
Chen et al.

(10) Patent No.: US 10,859,265 B2
(45) Date of Patent: *Dec. 8, 2020

(54) DYNAMIC FIRE SYSTEM HAVING A FLOW CONTROL APPARATUS FOR GENERATING A CONTROL SIGNAL BASED ON AN AUDIO SIGNAL

(71) Applicant: Chung-Yang Chen, Xindian (TW)

(72) Inventors: Chung-Yang Chen, Xindian (TW); Stephen James Paladino, Murfreesboro, TN (US); Robert John Buckley, Incline Village, NV (US)

(73) Assignee: Chung-Yang Chen, New Taipei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/400,627

(22) Filed: May 1, 2019

(65) Prior Publication Data

US 2019/0285274 A1 Sep. 19, 2019

Related U.S. Application Data

(63) Continuation-in-part of application No. 15/920,935, filed on Mar. 14, 2018, now Pat. No. 10,330,316.

(51) Int. Cl.
*G06F 17/00* (2019.01)
*F23N 1/00* (2006.01)
(Continued)

(52) U.S. Cl.
CPC ............ *F23N 1/005* (2013.01); *F23C 99/003* (2013.01); *F23N 1/002* (2013.01); *F24B 1/1808* (2013.01); *F24B 1/199* (2013.01);
*G05D 7/0635* (2013.01); *H03F 3/68* (2013.01); *H04R 3/04* (2013.01); *F23N 2223/08* (2020.01);
(Continued)

(58) Field of Classification Search
CPC ........ F23N 1/005; F23N 1/002; F23C 99/003; F24B 1/1808; F24B 1/199; G05D 7/0635; G06F 3/165
See application file for complete search history.

(56) References Cited

U.S. PATENT DOCUMENTS 1,977,997 A 10/1934 Patterson
3,165,966 A 1/1965 Pribyl
(Continued)

*Primary Examiner* — Joseph Saunders, Jr.
(74) *Attorney, Agent, or Firm* — Muncy, Geissler, Olds & Lowe, P.C.

(57) ABSTRACT

A flow control apparatus includes a flow control signal generation device for generating a DC control signal based on an audio signal and at least one proportional valve. The flow control signal generation device includes an audio receiving module, a filter rectifier module, a microprocessor and a proportional valve control signal generation module. The filter rectifier module generates at least one DC audio signal by filtering the audio signal provided by the audio receiving module. The microprocessor generates a plurality of period attenuated values based on the DC audio signal. The proportional valve control signal generation module filters the audio signal, attenuates the signal based on the period attenuated values, and then performs filtering and rectification processing to generate the DC control signal, such that the proportional valve may control the opening ratio of the proportional valve based on the DC control signal.

21 Claims, 7 Drawing Sheets

(51) Int. Cl.
 *G05D 7/06* (2006.01)
 *F24B 1/18* (2006.01)
 *H04R 3/04* (2006.01)
 *H03F 3/68* (2006.01)
 *F24B 1/199* (2006.01)
 *F23C 99/00* (2006.01)

(52) U.S. Cl.
 CPC ...... *F23N 2223/22* (2020.01); *H03F 2200/03* (2013.01); *H03F 2200/165* (2013.01)

(56) References Cited

U.S. PATENT DOCUMENTS

| | | | |
|---|---|---|---|
| 4,376,404 A | 3/1983 | Haddad | |
| 5,069,387 A | 12/1991 | Alba | |
| 5,890,485 A * | 4/1999 | Shimek | F24C 3/006 |
| | | | 126/512 |
| 6,276,612 B1 | 8/2001 | Hall | |
| 6,611,114 B1 | 8/2003 | Yen | |
| 6,717,383 B1 | 4/2004 | Brunt et al. | |
| 6,746,131 B1 | 6/2004 | Goldstein et al. | |
| 8,614,632 B1 | 12/2013 | Wells et al. | |
| 8,823,714 B1 * | 9/2014 | Thielvoldt | F23N 1/002 |
| | | | 126/500 |
| 10,240,796 B1 * | 3/2019 | Stilwell | F24B 1/191 |
| 10,746,407 B1 * | 8/2020 | Mann | F23D 14/465 |
| 2008/0206695 A1 * | 8/2008 | Ormond | F23D 14/20 |
| | | | 431/196 |
| 2015/0047627 A1 * | 2/2015 | Thielvoldt | F23N 1/002 |
| | | | 126/503 |
| 2019/0242577 A1 * | 8/2019 | Mann | F23N 1/002 |

* cited by examiner

DYNAMIC FIRE SYSTEM HAVING A FLOW CONTROL APPARATUS FOR GENERATING A CONTROL SIGNAL BASED ON AN AUDIO SIGNAL

CROSS-REFERENCE TO RELATED APPLICATION

This application is a Continuation-in-Part application of U.S. patent application Ser. No. 15/920,935, filed Mar. 14, 2018, and titled "Flow Control Apparatus and Flow Control Generation Device Thereof for Generating DC Control Signal Based on Audio Signal," the disclosure of which is hereby incorporated herein by reference in its entirety.

FIELD

The present disclosure is related to a dynamic fire system having a flow control apparatus and a flow control signal generation device for producing a dynamic flame, and more particularly is related to an audio-reactive fire system that generates a dynamic flame based on an audio signal.

BACKGROUND

When entertaining or creating a casual environment, fire and music may be used to set the atmosphere of the setting. However, most traditional fireplaces or fire pits are static and, while they provide some heat an ambiance, they are not typically dynamic or actively controlled.

The embodiments described herein are related to a dynamic fireplace or fire system that can be controlled or modulated in response to an audio signal.

SUMMARY

The conventional flow controller controls the flow of flammable gas based on the volume of the music to cause flame change. However, when the music comes from a composition of various sounds, the rhythm change may not have a corresponding volume change such that the fire dance demonstrated by using the conventional flow controller cannot show the rhythm change to deliver the rhythm of music to the people. Accordingly, it is a main object of the present disclosure to provide a flow control apparatus and a flow control signal generation device for generating a direct current (DC) control signal based on an audio signal, to have the fire dance showing the change corresponding to the music rhythm.

In order to achieve the above mentioned object, the embodiments described herein provide a flow control signal generation device for generating a DC control signal based on an audio signal, which is utilized for controlling a flow volume provided by a fluid supplier through a proportional valve to a nozzle. The flow control signal generation device comprises an audio receiving module, a filter rectifier module, a microprocessor, and a proportional valve control signal generation module.

The audio receiving module is utilized for providing an audio signal. The filter rectifier module is electrically connected to the audio receiving module and may be used for filtering the audio signal to generate at least one DC audio signal. The microprocessor is electrically connected to the filter rectifier module and may be used for analyzing strength of the at least one DC audio signal within a plurality of time periods to generate a plurality of period strength values, and may compare the period strength values and a predetermined attenuated strength value to generate a plurality of period attenuated values.

The proportional valve control signal generation module comprises a first low-pass filter, an attenuator, a second low-pass filter, and a first rectifier filter. The first low-pass filter is electrically connected to the audio receiving module, for receiving and filtering the audio signal to generate a first low frequency-band signal, and the frequency of the first low frequency-band signal is under a first frequency. The attenuator is electrically connected to the first low-pass filter and the microprocessor, for attenuating a strength value of the first low frequency-band signal to a value close to the predetermined attenuated strength value based on the period attenuated values. The second low-pass filter is electrically connected to the attenuator, for receiving and filtering the first low frequency-band signal to generate a second low frequency-band signal, and the frequency of the second low frequency-band signal is under a second frequency which is smaller than the first frequency. The first rectifier filter is electrically connected to the second low-pass filter, for converting the second low frequency-band signal into a DC control signal and transmitting the DC control signal to a proportional valve to have the proportional valve adjusting opening ratio of the proportional valve based on the DC control signal.

In accordance with an embodiment of the present disclosure, the filter rectifier module comprises a high-pass filter and, in some cases, a rectifier filter unit. The high-pass filter is electrically connected to the audio receiving module, for receiving and filtering the volume control signal to generate a first high frequency-band signal, and the frequency of the first high frequency-band signal is above a third frequency. The rectifier filter unit is electrically connected to the high-pass filter and the microprocessor, for converting the first high frequency-band signal into at least one DC audio signal, and transmitting the at least one DC audio signal to the microprocessor.

In some embodiments, the filter rectifier module further comprises a first signal amplifier, which is located between the high-pass filter and the at least one rectifier filter unit, for amplifying strength of the first high frequency-band signal.

In an embodiment, the rectifier filter unit comprises a second rectifier and a second signal amplifier. The second rectifier is electrically connected to the first signal amplifier, for receiving and regulating the first high frequency-band signal. The second signal amplifier is electrically connected between the second rectifier filter and the microprocessor, for amplifying strength of the regulated first high frequency-band signal and transmitting the regulated first high frequency-band signal to the microprocessor.

In an embodiment, the rectifier filter unit comprises a third low-pass filter and a third rectifier filter. The third low-pass filter is electrically connected to the first signal amplifier, for receiving and filtering the first high frequency-band signal to limit the frequency of the first high frequency-band signal under a fourth frequency. The third rectifier filter is electrically connected to the third low-pass filter and the microprocessor, for regulating the filtered first high frequency-band signal with the frequency thereof under the fourth frequency.

In an embodiment, the rectifier filter unit comprises a band pass filter and a fourth rectifier filter. The band pass filter is electrically connected to the first signal amplifier, for receiving and filtering the first high frequency-band signal to limit the frequency of the first high frequency-band signal within a frequency range. The fourth rectifier filter is electrically connected to the band pass filter and the microprocessor, for regulating the filtered first high frequency-band signal with the frequency thereof limited in the frequency range.

A flow control apparatus is also provided in the present invention, which comprises the above mentioned flow control signal generation device for generating a DC control signal based on an audio signal and at least a proportional valve.

As mentioned above, because the flow control apparatus and the flow control signal generation device for generating the DC control signal based on the audio signal have the feature of the rectifier filter module for filtering the audio signal, the DC control signal can be generated based on the audio signal of a specific frequency band such that the proportional valve is capable to adjust the flow volume of the fluid through the proportional valve to the nozzle based on the DC control signal.

Various embodiments will now be specified with reference to its preferred embodiment illustrated in the following drawings.

DETAILED DESCRIPTION

Figure 1:
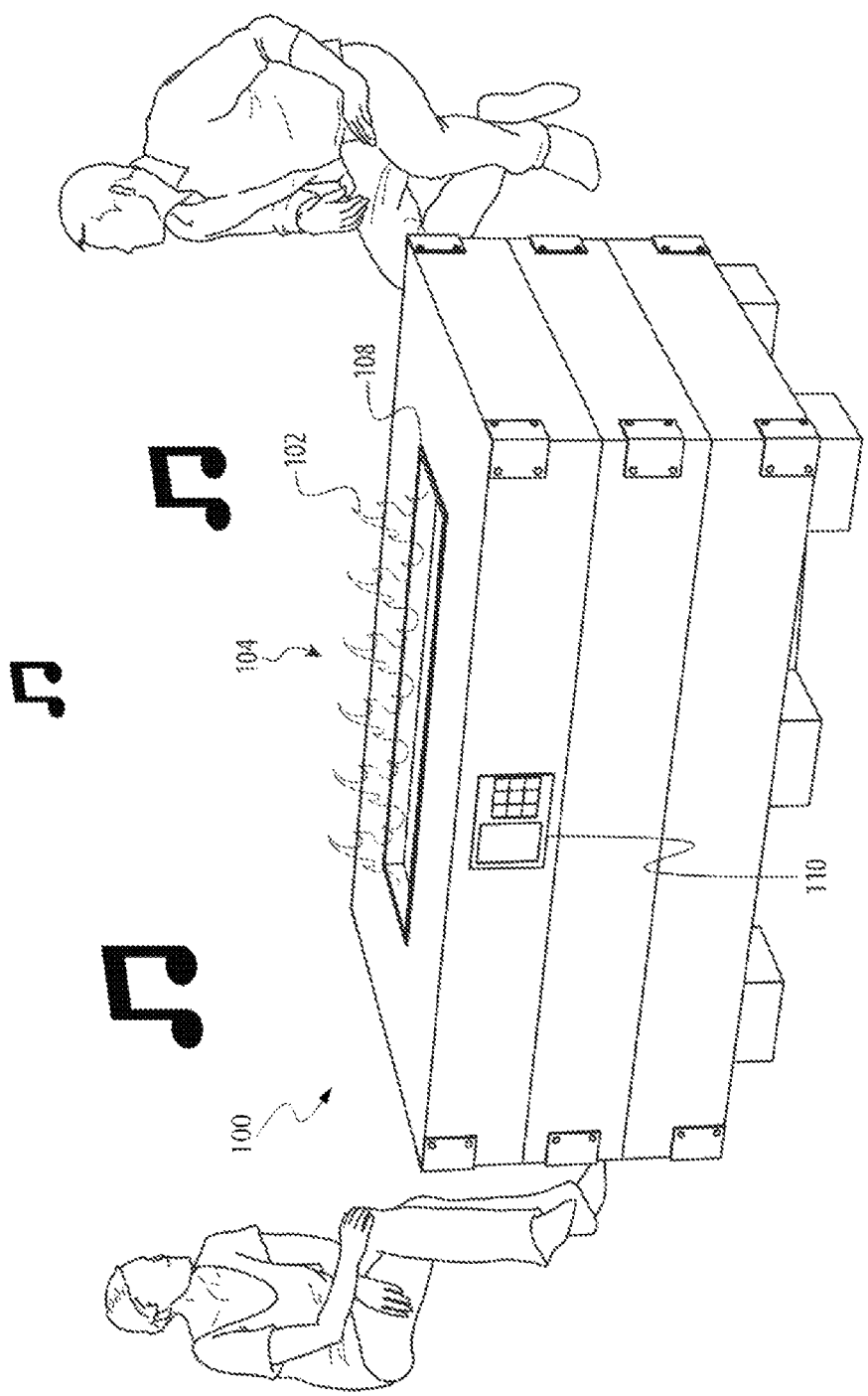
FIG. 1 depicts an example fireplace system.

The specific structural and functional details disclosed herein are only representative and are intended for describing exemplary embodiments of the disclosure. It is noted that, in the disclosure, similar elements would be represented by the same labels. Moreover, the drawings are for the purpose of illustration. The drawings may not be drawn based on precise proportions, and the drawing may not contain all the details.

When hosting a large event or entertaining a group of people, in order to contribute to the atmosphere of the setting, it may be beneficial to create a dynamic or interesting setting that draws people in or keeps them at the event. In accordance with the embodiments described herein, a dynamic fireplace, dynamic fire system, or other type of flame emitting apparatus may be used to create a dynamic and unique experience. Specifically, embodiments described herein are directed to a dynamic fireplace, fire system, or other type of flame emitting apparatus in which the height and/or intensity of the flame may be modulated in accordance with an audio signal (e.g., ambient music). In accordance with some embodiments, while a music track or other audio signal is played, the flames of the fireplace or fire system will appear to dance or bounce in accordance with the rhythm of the music track or audio signal. This visual effect produced by the modulating or dynamic flame may be referred to herein as a "dynamic flame," "fire dance," or "flame display."

While some of the following examples are directed to a dynamic fireplace, dynamic fire system, or other type of flame emitting apparatus, the embodiments described herein are not limited to those specific examples and may be more broadly directed to the control of an gas in accordance with an audio signal. For example, the flow control embodiments described herein may be used to control a gas delivery system for a gas-powered lighting system, a gas-powered display, or other type of system or visual arrangement that produces a variable or dynamic flame.

In some cases, the performance of a dynamic flame, fire dance, or flame display may be executed by using a flow controller that is configured to analyze the volume of the audio signal and control the flow of flammable gas based on the volume to have the flame changed with the volume. When an audio signal is primarily composed of a single musical instrument or human voice, the height and/or intensity of the flame may follow the rhythm of the audio signal due to a significant or distinct volume change. However, when the audio signal comes from a composition of various music instruments and/or human voice(s), the rhythm may not exhibit a corresponding volume change. For example, the volume may be kept high, because of the mixing of the audio from the various musical instruments and the human voice(s). Under these circumstances, a conventional flow controller may keep a large flame but may not be able to deliver the rhythm of music.

The embodiments described herein may be used to produce a fire dance or fire display that more accurately corresponds to the rhythm or beat of an audio track. Examples of these embodiments are described below with respect to FIGS. 1-7.

FIG. 1 depicts an example fireplace 100 in accordance with some embodiments. The fireplace 100 depicted in FIG. 1 is an open area fireplace in which the flames are exposed and not contained within a shroud or structure. In some cases, the open area fireplace may include a glass guard or other type of structure that surrounds the flames. The fireplace 100 is provided as a specific example of a fire system, which may also be referred to generally as a flame emitting apparatus. The fireplace 100 is provided as one example of a gas-powered system and is not intended to be limiting in nature.

As mentioned previously, a dynamic fireplace may modulate the flame height or flame distribution in accordance with some dynamic input. For example, the fireplace 100 may be configured to produce flames of varying heights and intensities by controlling or modulating a flow of gas to a tube or other burner component. In some implementations, the fireplace 100 is configured to modulate the flame height, flame distribution, and/or, flame intensity in accordance with an audio input signal. The audio input signal may be provided via an audio connection, Bluetooth connection, microphone, or some other device that is configured to receive a signal and/or detect ambient audio or other sounds. Any form of audio, whether digital, analog, or other signal that is transmitted to or otherwise detected by the fireplace 100 may be referred to herein as an "audio input."

In some implementations, a flow of gas to the burner may be modulated in accordance with the audio input to vary the flame height, flame distribution, and/or, flame intensity. As one example, the flame height may be varied in accordance with an amplitude of a particular frequency range of the audio input. As the amplitude of the frequency range increases, the flow of gas may be modulated to produce an increased flame height. In some cases, the flame height, flame distribution, and/or, flame intensity is varied in accordance with a drum beat, rhythm, or some other aspect of the audio input. In some cases, the fireplace 100 may include one or more speakers that are configured to produce an audio output that corresponds to the audio input. The flame height, flame distribution, and/or, flame intensity may be modulated to correspond to the audio output of the speakers to produce what appears to be a flame that is synchronized with the audio being played by the fireplace 100.

As shown in FIG. 1, the fireplace 100 may have a base 104 and burner assembly 108 at least partially positioned within the base 104. The base 104 may be a structural member of the fireplace that houses various internal components of the fireplace 100, such as an gas-control system, including various processing units and valve systems, as described in greater detail below with respect to FIGS. 2-7. It will be appreciated, however, that the base 104 is shown in FIG. 1 for purposes of illustration, and that other constructions of the base 104 are possible and contemplated herein, including structures having cantilevered members, and/or other structural or aesthetic members. Accordingly, while the burner assembly 108 is shown positioned within an opening defined in a top surface of the base 104, other configurations are possible.

Broadly, the burner assembly 108 is configured to emit gas and form a flame along an exterior surface of the fireplace 100. In some implementations, the burner assembly 108 includes an orifice tube that is configured to emit a flame through a bed of aggregate, a flame screen, a grill, or other component(s) that is configured to alter the physical appearance or quality of the flame. These components may alter a characteristic of the flame, such as increasing a flame height, altering the flame distribution, and/or changing the color of the flame.

As described herein, the fireplace 100 may be a dynamic fireplace. Accordingly, the height, distribution, and/or intensity of the flame 102 may change based on a variety of inputs, including audio inputs. With reference to FIG. 1, the fireplace 100 may be configured to produce a flame 102 that varies in height, intensity, and/or in other manners in accordance with an audio signal. For example, the flame 102 may have a height and/or intensity that varies in accordance with an audio signal, which is indicated in FIG. 1 by musical notes. In one example, as the height and/or intensity of the flame 102 is momentarily increased in accordance with a beat or rhythm of the audio signal. In accordance with the embodiments described herein, the gas producing the flame 102 may be modulated in order to produce a periodic or rhythmic modulated output causing the flame 102 to appear to dance, bounce or otherwise respond in accordance with a music track of the audio signal. The control systems described herein with respect to FIGS. 3-7 provide example embodiments that may be used to produce the desired flame.

Figure 2:
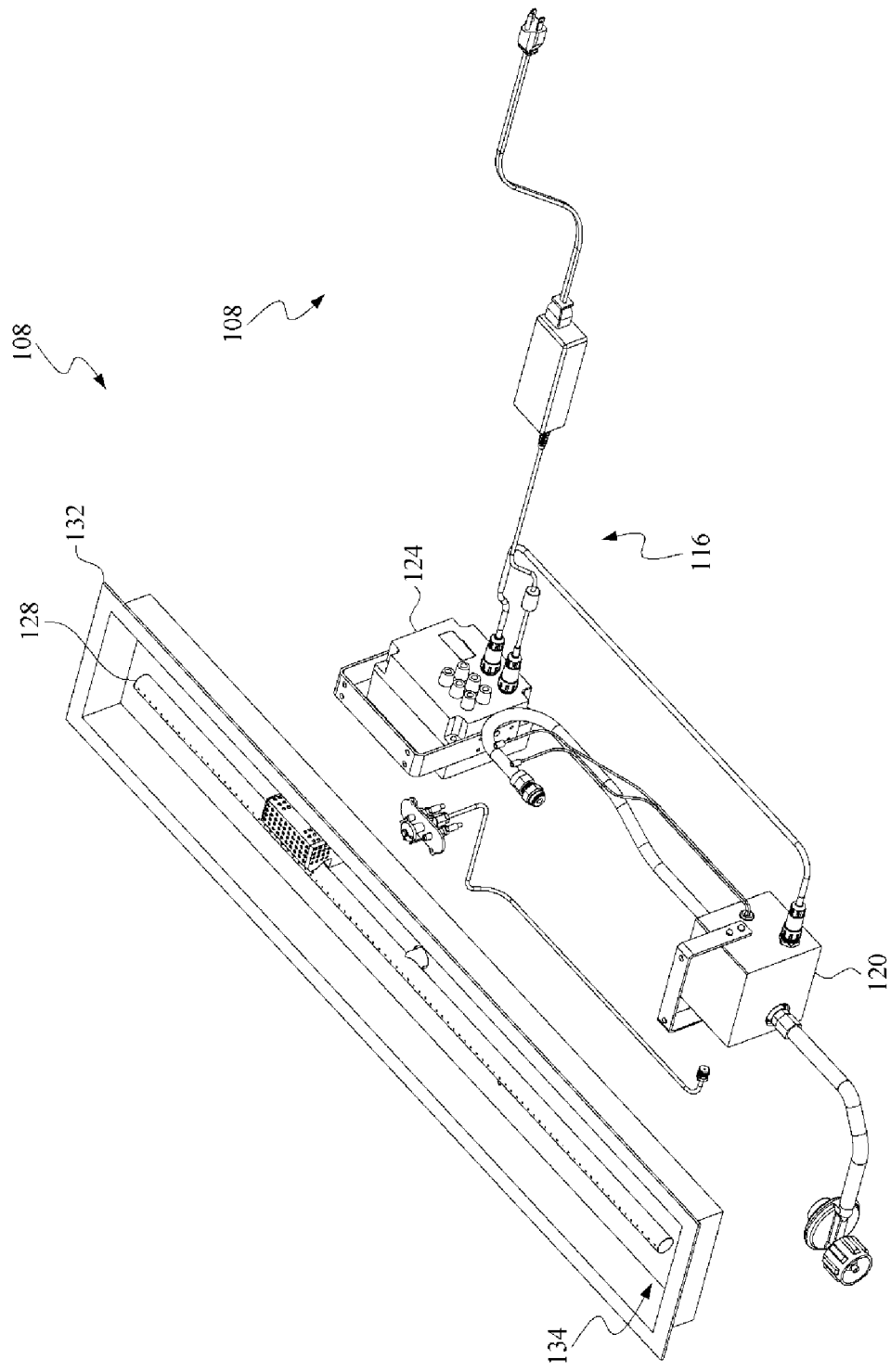
FIG. 2 depicts an example burner assembly.

FIG. 2 shows an exploded view of the burner assembly 108. The burner assembly 108 may generally include any appropriate components, systems, subsystems, and so on that operate to produce a flame for a fireplace or fire system (e.g., fireplace 100 of FIG. 1). In the embodiment of FIG. 2, the burner assembly 108 may include a tube 128, a pan 132, and an gas-control system 116, among other components and assemblies.

The gas-control system 116 may generally be configured to provide and regulate a flow of gas that is used by the burner assembly 108 to produce a flame. Various examples of a gas-control system are described below with respect to FIGS. 3-7. In general, the gas-control system 116 may be coupled with a gas source, such as a tank, flow line, and/or other appropriate source. The gas-control system 116 may include a valve system 120. The valve system 120 may include one or regulators, controls, valves, and/or other components that may be used to control a flow of gas within the burner assembly. The valve system 120 may be configured to control the flow of the gas based on one or more input signals. To illustrate, the valve system 120 may increase a flow of gas based on a receipt of a first portion of an input signal, and, subsequently, the valve system 120 may decrease (or cease) a flow of gas based on a receipt of a second portion of an input signal. The input signals may be received from a variety of components and systems, including user input received at a hardwired or remote touchpad, such as that from an external mobile device.

In certain embodiments, the valve system 120 may receive input signals from an processing unit, such as the processing unit 124 shown in FIG. 2. The processing unit 124 may generally be any device or system that is configured to produce a signals or signals that can be used to control the valve system 120. In some cases, the processing unit 124 may also produce an audio output that may be used to control one or more speakers. The processing unit 124 may include a processor, control electronics, sensors electronics, instruments, and/or other hardware that is configured to facilitate the functions described herein. As shown in FIG. 2, the processing unit 124 may be operatively coupled with the valve system 120. The valve system 120 may receive input signals from the processing unit 124 that are associated with the audio output. For example, the valve system 120 may receive signals associated with a volume, tempo, beat, track, and/or other characteristic of the audio output. The valve system 120 may, in turn, modulate a flow of gas based on the received signal. As an illustration, where the signal corresponds to an increase in volume of the audio output, the flow of gas may be increased, whereas the flow of gas may be decreased when the signal corresponds to a decrease in the volume of the audio output.

The gas-control system 116 may be configured to direct gas to the tube 128. The tube 128 may be an elongated member at which gas is emitted in order to form a flame. For example, the tube 128 may include an array of orifices that are arranged along a length of the tube. The orifices may be configured to emit gas and maintain a flame when the emitted gas is ignited. As such, the gas-control system 116, as shown in FIG. 2, may be operatively coupled with the tube 128. In particular, the valve system 120 may be operatively coupled with the tube 128 in a manner that allows the flow of gas to be regulated at the valve system to flow into the tube 128 and toward the orifices. In some cases, the tube 128 may include multiple groups of orifices that are individually controlled or modulated. This may allow a single tube to produce multiple flames or groups of flames, each flame of flame group able to be independently controlled by the system. Similarly, in some embodiments, the system may include multiple orifice tubes 128 that may be either controlled independently or controlled in tandem or by a shared gas control system 116.

The tube 128 may be at least partially positioned within the pan 132. The pan 132 may define an elongated channel 134 and the tube 128 may extend along the elongated channel 134. The pan 132 may include one or more holes that allow the tube 128 to be operatively coupled with the gas-control system 116. For example, one or more conduits, intakes, and/or other components may pass through holes defined in the pan 132 and be fluidically coupled with the gas-control system 116. This may allow the elongated channel 134 of the pan 132 to be positioned facing an exterior surface of a fireplace, and the gas-control system 116 may be positioned below the pan 132 and substantially concealed from view.

Figure 3:
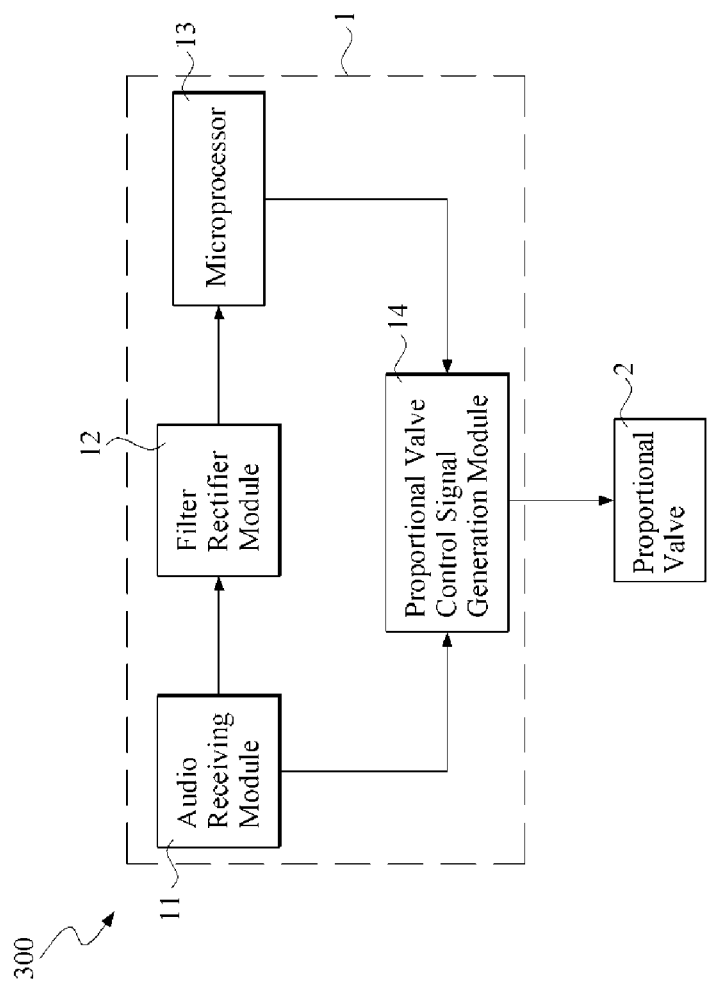
FIG. 3 depicts a block diagram showing the flow control signal generation device for generating a DC control signal based on an audio signal in accordance with a one embodiment.
Figure 4:
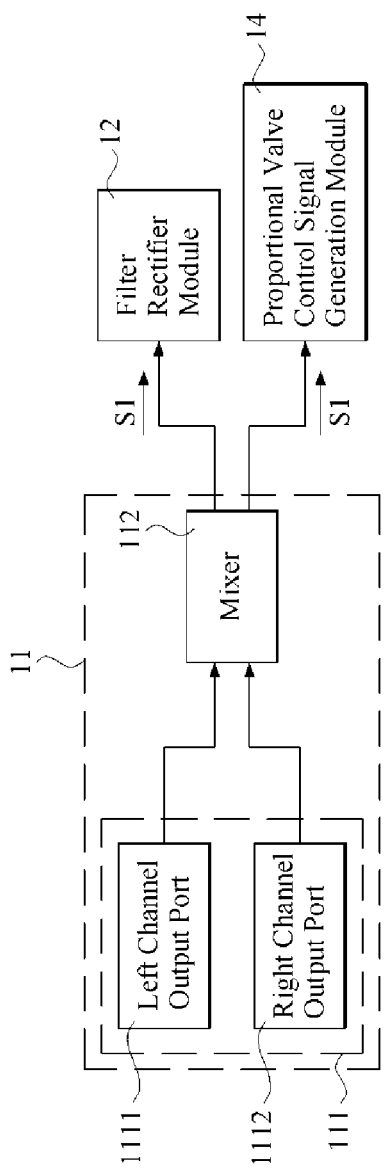
FIG. 4 is a block diagram depicting an example audio receiving module.
Figure 5:
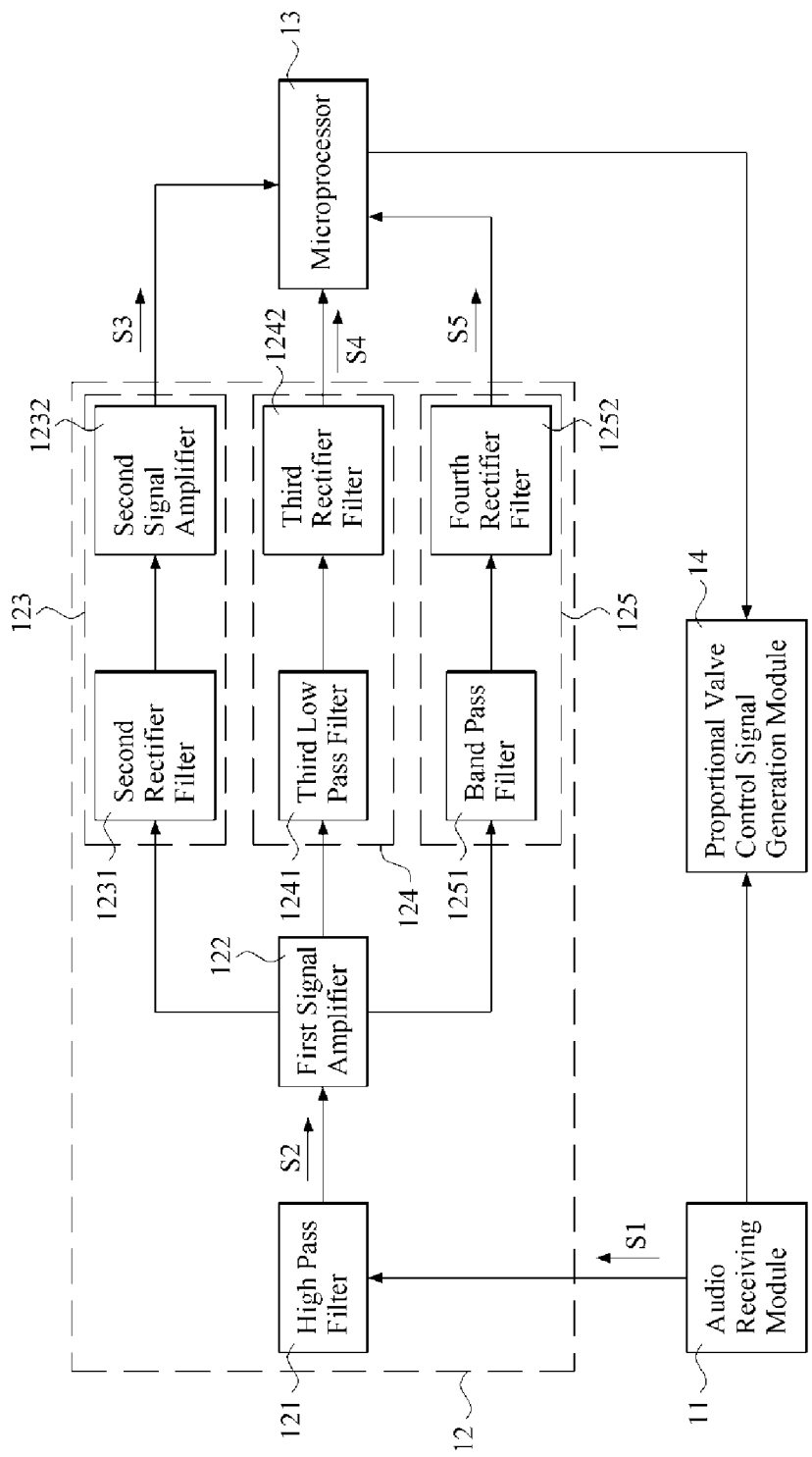
FIG. 5 is a block diagram depicting an example filter rectifier module.
Figure 6:
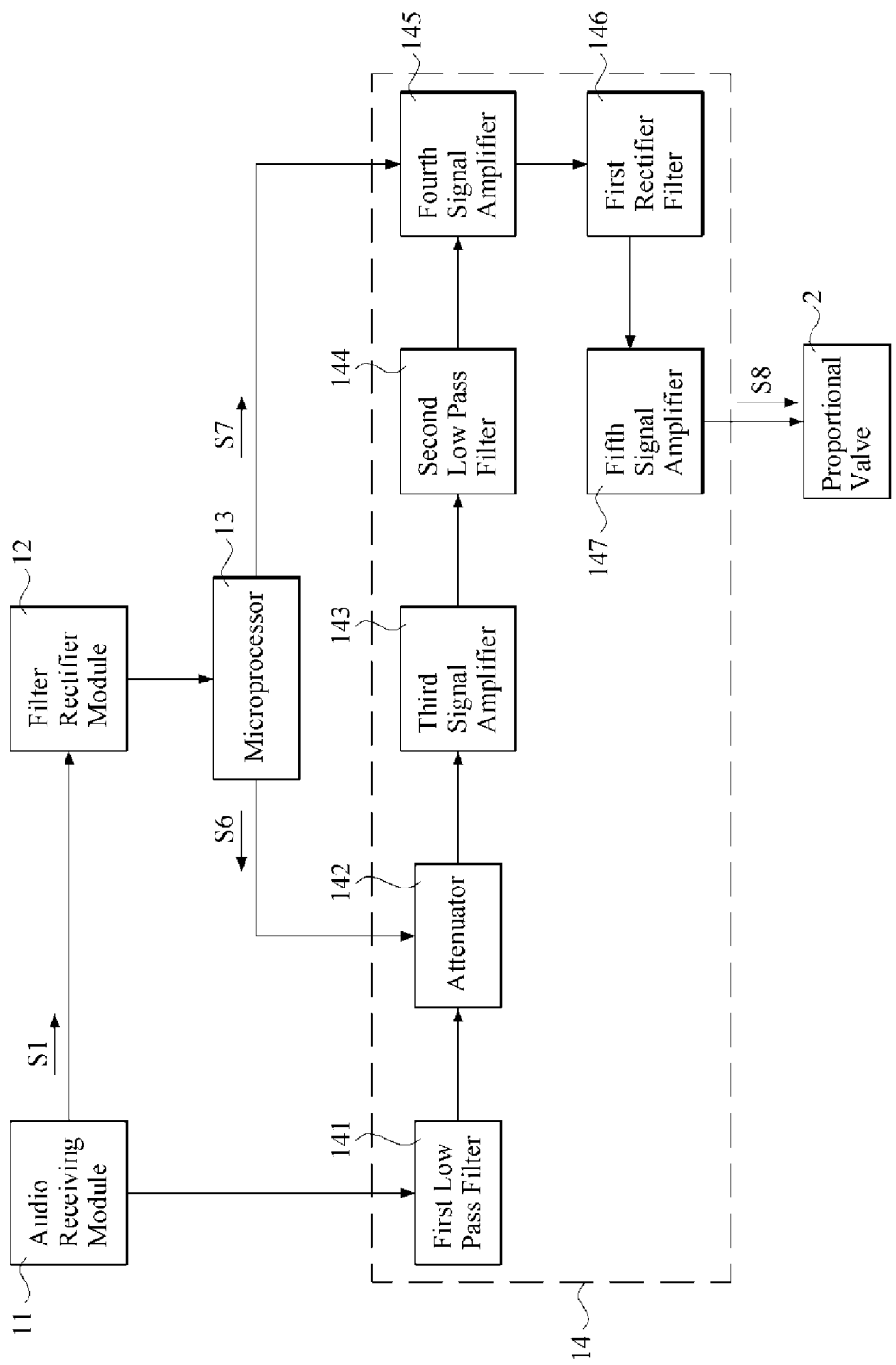
FIG. 6 is a block diagram depicting an example proportional valve control signal generation module.

FIGS. 3-7 depict various aspects of a gas-control system that may be implemented in a gas-based system including, but not limited to, the gas fireplace 100 described above with respect to FIG. 1. In particular, FIG. 3 depicts a block diagram showing the flow control signal generation device for generating a DC control signal based on an audio signal in accordance with a preferred embodiment of the present invention, FIG. 4 depicts a block diagram showing the audio receiving module, FIG. 5 depicts a block diagram showing the filter rectifier module, and FIG. 6 is a block diagram showing the proportional valve control signal generation module.

As shown in FIG. 3, the flow control apparatus 300 includes a flow control signal generation device 1 for generating a DC control signal based on an audio signal and a proportional valve 2. The flow control signal generation device 1 includes an audio receiving module 11, a filter rectifier module 12, a microprocessor 13 and a proportional valve control signal generation module 14.

The audio receiving module 11 is utilized for providing an audio signal S1 and includes an audio output unit 111 and a mixer 112. The audio output unit 111 includes a left channel output port 1111 and a right channel output port 1112. However, in some embodiment, the audio output unit may include a single output port or may include more than two output ports. In practice, the audio receiving module 11 is utilized for receiving the audio source signal from Bluetooth, USB disk, radio, or wired input, and processing the audio source signal as the left channel signal and the right channel signal. The left channel signal is outputted from the left channel output port 1111, the right channel signal is outputted from the right channel output port 1112, and the mixer 112 is utilized for integrating the left channel signal and the right channel signal into an audio signal S1 to be outputted.

In some embodiments, the filter rectifier module 12 includes a high-pass filter 121, a first signal amplifier 122, a rectifier filter unit 123, a rectifier filter unit 124, and a rectifier filter unit 125. The high-pass filter 121 is electrically connected to the audio receiving module 11, for receiving and filtering the audio signal S1 to generate a first high frequency-band signal S2. The frequency of the first high frequency-band signal S2 is above a third frequency. The third frequency may be ranged between 10 Hz and 50 Hz. In some cases, the third frequency may be ranged between 5 Hz and 100 Hz or other range of values. Thereby, the high-pass filter 121 is capable to filter out the unwanted portions of the audio signal S1.

In some embodiments, the first signal amplifier 122 is electrically connected to the high-pass filter 121 for receiving the first high frequency-band signal S2 and amplifying the strength of the first high frequency-band signal S2.

The rectifier filter unit 123 includes a second rectifier filter 1231 and a second signal amplifier 1232. The second rectifier filter 1231 is electrically connected to the first signal amplifier 122 for receiving the amplified first high frequency-band signal S2, and regulating and filtering the first high frequency-band signal S2. The second signal amplifier 1232 is electrically connected to the second rectifier filter 1231, for further amplifying the first high frequency-band signal S2 after being regulated and filtered by the second rectifier filter 1232, so as to generate a DC audio signal S3. The rectifier filter unit 123 regulates the first high frequency-band signal S2 to generate the DC electric signal mainly by using the second rectifier filter 1231, and further amplifies the signal strength of the electric signal by using the second signal amplifier 1232. In some implementations, the DC audio signal S3 is generated by filtering and smoothing the first high frequency-band signal S2 above 50 HZ using the second rectifier filter 1231, and the DC audio signal S3 is a DC voltage level.

The rectifier filter unit 124 includes a third low-pass filter 1241 and a third rectifier filter 1242. The third low-pass filter 1241 is electrically connected to the first signal amplifier 122, for receiving the amplified first high frequency-band signal S2, and regulating and filtering the first high frequency-band signal S2 to restrict the frequency of the first high frequency-band signal S2 under a fourth frequency. The third rectifier filter 1242 is electrically connected to the third low-pass filter 1241 for regulating the filtered first high frequency-band signal S2 with the frequency thereof restricted under the fourth frequency so as to generate a DC audio signal S4. The fourth frequency is ranged between 100 HZ and 400 HZ. The rectifier filter unit 124 keeps the bass beat signal mainly by using the third low-pass filter 1241, and amplifies the signal strength by using the third rectifier filter 1242.

The rectifier filter unit 125 includes a band pass filter 1251 and a fourth rectifier filter 1252. The band pass filter 1251 is electrically connected to the first signal amplifier 122 for receiving the amplified first high frequency-band signal S2, and filtering the first high frequency-band signal S2 to restrict the frequency of the first high frequency-band signal S2 within a frequency range. The fourth rectifier filter 1252 is electrically connected to the band pass filter 1251 for regulating the filtered first high frequency-band signal S2 with the frequency thereof restricted in the frequency range, so as to generate a DC audio signal S5. The lower limit of the frequency range can be ranged between 100 HZ to 300 HZ and the higher limit can be ranged between 1000 HZ and 2000 HZ so as to filter the portion with respective to the voice frequency from the first high frequency-band signal S2.

The microprocessor 13 is electrically connected to the second signal amplifier 1232, the third rectifier filter 1242 and the fourth rectifier filter 1252, for analyzing the strength of the DC audio signals S3, S4, and S5 within a plurality of time periods to generate a plurality of period strength values, and comparing the period strength values and a predetermined attenuated strength value to generate a plurality of period attenuated values S6. The microprocessor 13 uses the DC voltage level as a reference of gain control for the dynamic range of the audio signal S1. In addition, as the microprocessor 13 determines that the DC audios signal S5 with respective to voice frequency is smaller than the DC audio signal S4 with respective to bass beat by comparing the DC audio signal S4 and the DC audio signal S5, the microprocessor 13 may further control the rectifier filter unit 125 to attenuate the signal to a small degree (such as the attenuation of 3 dB, wherein dB is the unit of power gain defined by 10*log (P2/P1), P1 is the value before attenuation, and P2 is the value after attenuation) when filtering and regulating the first high frequency-band signal S2 to generate the DC audio signal S5, so as to prevent the large voice signal from interfering the determination of rhythm change.

As shown in the following table 1, take the rectifier filter unit 123 as an example, as the plurality of time periods are sectioned every 1 second and the predetermined attenuated strength value is −25 dB, the period attenuated value with respective to each of the time periods can be calculated as below.

TABLE 1

| time period (second) | DC audio signal S3 (dB) | predetermined attenuated strength value (dB) | period attenuated value S6 (dB) |
|---|---|---|---|
| 0-1 | −8 | −25 | −17 |
| 1-2 | −7 | −25 | −18 |
| 2-3 | −7 | −25 | −18 |
| 3-4 | −8 | −25 | −17 |
| 4-5 | −9 | −25 | −16 |
| 5-6 | −8 | −25 | −17 |
| 6-7 | −9 | −25 | −16 |
| 7-8 | −10 | −25 | −15 |
| 8-9 | −11 | −25 | −14 |
| 9-10 | −12 | −25 | −13 |
| 10-11 | −10 | −25 | −15 |
| 11-12 | −8 | −25 | −17 |
| 12-13 | −8 | −25 | −17 |
| 13-14 | −7 | −25 | −18 |
| 14-15 | −8 | −25 | −17 |

The proportional valve control signal generation module 14 includes a first low-pass filter 141, an attenuator 142, a third signal amplifier 143, a second low-pass filter 144, a fourth signal amplifier 145, a first rectifier filter 146, and a fifth signal amplifier 147. The example proportional valve control signal generation module 14 is provided by way of example and, depending on the implementation, may include fewer or additional elements not expressly depicted in the example flow or schematic diagrams. For example, in some embodiments, the proportional valve control signal generation module 14 may include additional low-pass filters or fewer low-pass filters than depicted in the example of FIG. 6. Additionally, the proportional valve control signal generation module 14 may include additional elements or components for processing signals or performing other functions, which are omitted from the illustrative example for purposes of clarity.

As shown in FIG. 6, the first low-pass filter 141 is electrically connected to the audio receiving module 11, for receiving and filtering the audio signal S1 to generate a first low frequency-band signal. The frequency of the first low frequency-band signal is under 6000 HZ.

The attenuator 142 is electrically connected to the first low-pass filter 141 and the microprocessor 13, for attenuating the strength value of the first low frequency-band signal to the value close to the predetermined attenuated strength value based on the period attenuated value S6. For example, as shown in table 1, during the time period 0-1 (second), the period attenuated value S6 would be −17 dB, and thus the strength value of the first low frequency-band signal would be close to the predetermined attenuated strength value (−25 dB) after being attenuated.

The third signal amplifier 143 is electrically connected to the attenuator 142 for amplifying the strength value of the attenuated first low frequency-band signal. The second low-pass filter 144 is electrically connected to the third signal amplifier 143 for receiving and filtering the first low frequency-band signal, so as to generate a second low frequency-band signal. The frequency of the second low frequency-band signal in the present embodiment is 200 HZ, and the attenuation of the strength value of the first low frequency-band signal is 3.5 dB. As discussed above, the second low-pass filter 144 may be optional. Furthermore, while two low-pass filters are depicted in the example embodiment of FIG. 6, more than two low-pass filters may be used.

In the example of FIG. 6, the fourth signal amplifier 145 is electrically connected to the second low-pass filter 144 for amplifying the strength value of the second low frequency-band signal. In addition, the fourth signal amplifier 145 is also electrically connected to the microprocessor 13. The microprocessor 13 will transmit a static flame height control signal S7 to the fourth signal amplifier 145 if none of the DC audio signals S3, S4, and S5 was received.

In the example of FIG. 6, the first rectifier filter 146 is electrically connected to the fourth signal amplifier 145 for regulating and filtering the second low frequency-band signal to generate a DC control signal S8. In practice, the first rectifier filter 146 may be a positive half-wave rectifier filter, and the DC control signal S8 is the DC signal after being regulated and filtered.

In the example of FIG. 6, the proportional valve 2 is electrically connected to the fifth signal amplifier 147 for receiving the DC control signal S8 and controlling the opening ratio of the proportional valve based on the DC control signal S8.

Figure 7:
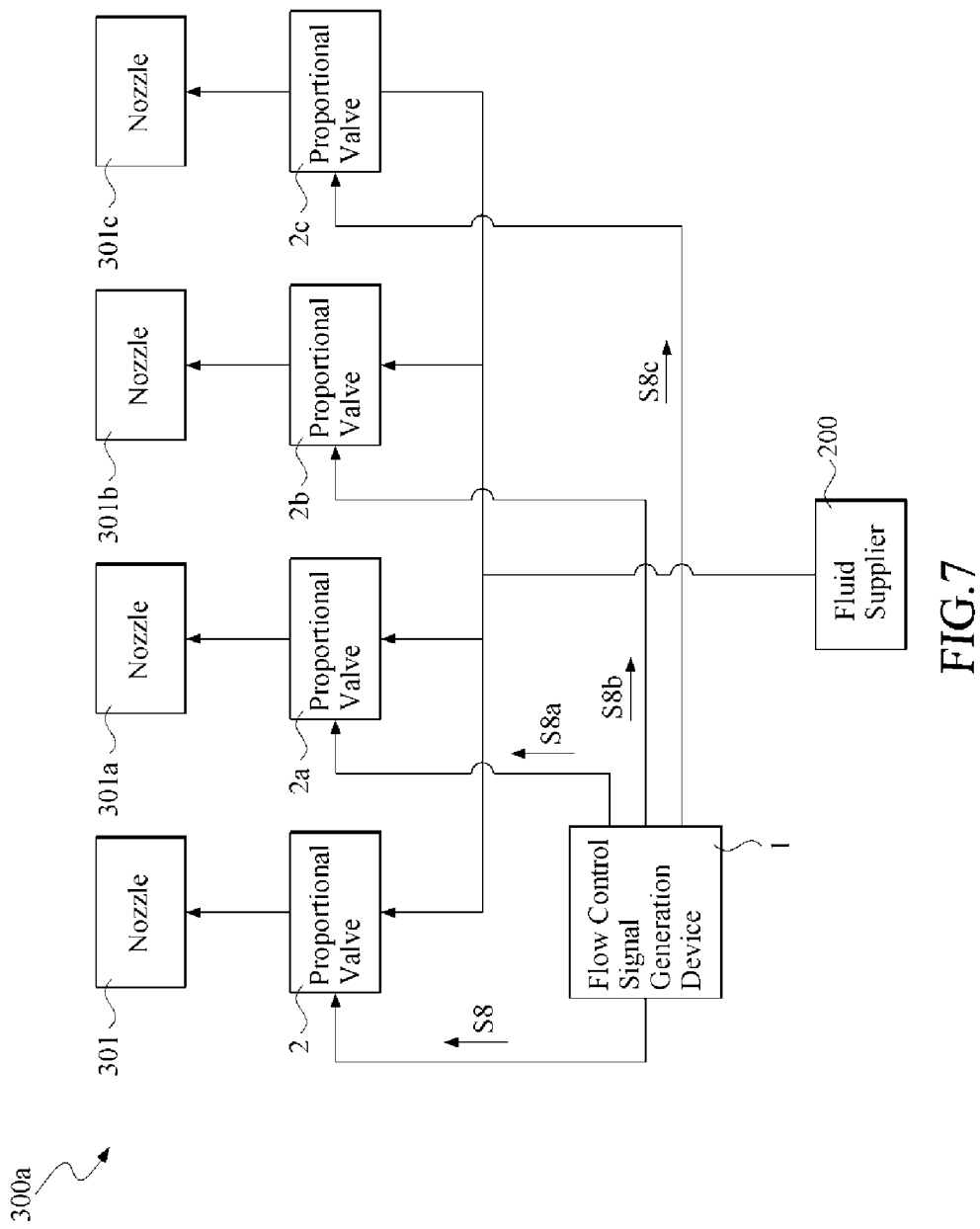
FIG. 7 is a schematic view of an example flow control apparatus provided in accordance with some embodiments.

Please refer to FIG. 7, which is a schematic view of a flow control apparatus provided in accordance with a second preferred embodiment of the present invention. As shown, the flow control apparatus 300a includes the above mentioned flow control signal generation device 1 and four proportional valves 2, 2a, 2b, and 2c. The proportional valves 2a, 2b, and 2c are similar to the proportional valve 2 mentioned above. Thus, the flow control signal generation device 1 would generate and transmit four DC control signals S8, S8a, S8b, and S8c to the proportional valves 2, 2a, 2b, and 2c respectively to have the proportional valves 2, 2a, 2b, and 2c adjust the opening ratio thereof based on the DC control signals S8, S8a, S8b, and S8c respectively such that the fluid supplied by the fluid supplier 200 to the nozzles 301, 301a, 301b, and 301c can be simultaneously controlled. In practical application, the fluid supplied by the fluid supplier 200 can be a flammable gas or a liquid. As the fluid is a flammable gas, the flow control apparatus can be applied to the performance of fire dance, and as the fluid is a liquid, the flow control apparatus can be applied to the performance of water dance.

In conclusion, because the flow control apparatus and the flow control signal generation device for generating the DC control signal based on the audio signal have the feature of the filter rectifier module for filtering the audio signal, the DC control signal can be generated based on the audio signal of a specific frequency band such that the proportional valve is capable to adjust the flow volume of the fluid through the proportional valve to the nozzle based on the DC control signal.

While the present invention has been particularly shown and described with reference to a preferred embodiment, it will be understood by those skilled in the art that various changes in form and detail may be without departing from the spirit and scope of the present invention.

What is claimed is:

1. A dynamic fireplace for producing a dynamic flame that is modulated in accordance with an audio signal, the dynamic fireplace comprising:
    an orifice tube that is configured to emit a flame; and
    a flow control signal generation device operably coupled to the orifice tube, configured to generate a DC control signal based on the audio signal, and comprising:
        an audio receiving module that is configured to receive an audio signal;
        a filter rectifier module that is electrically connected to the audio receiving module and configured to filter the audio signal and generate at least one DC audio signal;

a microprocessor, operably connected to the filter rectifier module, that is configured to analyze a strength of the at least one DC audio signal within a plurality of time periods and generate a plurality of period strength values, the microprocessor further configured to compare the plurality of period strength values to a predetermined attenuated strength value to generate a plurality of period attenuated values; and a proportional valve control signal generation module comprising:
   a first low-pass filter operably connected to the audio receiving module, the first low-pass filter configured to receive and filter the audio signal to generate a first low frequency-band signal, a frequency of the first low frequency-band signal being under a first frequency;
   an attenuator operably connected to the first low-pass filter and the microprocessor, the attenuator configured to attenuate a strength of the first low frequency-band signal to correspond to the predetermined attenuated strength value based on the period attenuated values; and
   a first rectifier filter operably connected to the first low-pass filter, the first rectifier filter configured to convert the first low frequency-band signal into a DC control signal and transmit the DC control signal to a proportional valve, the proportional valve configured to adjust an opening ratio of the proportional valve based on the DC control signal to control a flow of gas to the orifice tube and produce the dynamic flame.

2. The dynamic fireplace of claim 1, further comprising a second low-pass filter operably connected to the attenuator, the second low-pass filter configured to receive and filter the first low frequency-band signal to generate a second low frequency-band signal that is under a second frequency which is smaller than the first frequency, wherein the first rectifier filter is operably connected to the second low-pass filter and is configured to convert the second low frequency-band signal into the DC control signal.

3. The dynamic fireplace of claim 1, wherein the filter rectifier module comprises:
   a high-pass filter operably connected to the audio receiving module and configured to receive and filter the audio signal to generate a first high frequency-band signal, a frequency of the first high frequency-band signal being above a third frequency; and
   at least a rectifier filter unit, electrically connected to the high-pass filter and the microprocessor, the at least a rectifier filter unit configured to convert the first high frequency-band signal into at least one DC audio signal, and transmit the at least one DC audio signal to the microprocessor.

4. The dynamic fireplace of claim 3, wherein the filter rectifier module further comprises a first signal amplifier, located between the high-pass filter and the at least one rectifier filter unit, the first amplifier configured to amplifying a strength of the first high frequency-band signal.

5. The dynamic fireplace of claim 4, wherein the at least one rectifier filter unit comprises:
   a second rectifier filter electrically connected to the first signal amplifier and configured to receive the first high frequency-band signal; and
   a second signal amplifier, electrically connected between the second rectifier filter and the microprocessor, the second rectifier filter configured to amplify a strength of the regulated first high frequency-band signal and transmit the regulated first high frequency-band signal to the microprocessor.

6. The dynamic fireplace of claim 4, wherein the at least one rectifier filter unit comprises:
   a third low-pass filter, electrically connected to the first signal amplifier, the third low-pass filter configured to receive and filter the first high frequency-band signal to limit a frequency of the first high frequency-band signal under a fourth frequency; and
   a third rectifier filter, electrically connected to the third low-pass filter and the microprocessor, the third rectifier filter configured to regulate the filtered first high frequency-band signal with the frequency thereof under the fourth frequency.

7. The dynamic fireplace of claim 4, wherein the at least one rectifier filter unit comprises:
   a band pass filter, electrically connected to the first signal amplifier, the band pass filter configured to receive and filter the first high frequency-band signal to limit a frequency of the first high frequency-band signal within a frequency range; and
   a fourth rectifier filter, electrically connected to the band pass filter and the microprocessor, the fourth rectifier filter configured to regulate the filtered first high frequency-band signal with the frequency thereof limited in the frequency range.

8. A flow control signal generation device for a flame emitting apparatus and for generating a DC control signal based on an audio signal, utilized for controlling a flow volume provided by a fluid supply through a proportional valve to an orifice, and the flow control signal generation device comprising:
   an audio receiving module that is configured to receive an audio signal;
   a filter rectifier module electrically connected to the audio receiving module and configured to filter the audio signal to generate at least one DC audio signal;
   a microprocessor electrically connected to the filter rectifier module and configured to analyze a strength of the at least one DC audio signal within a plurality of time periods to generate a plurality of period strength values, and compare the period strength values and a predetermined attenuated strength value to generate a plurality of period attenuated values; and
   a proportional valve control signal generation module comprising:
      a first low-pass filter operably connected to the audio receiving module and configured to receive and filter the audio signal to generate a first low frequency-band signal, a frequency of the first low frequency-band signal being under a first frequency;
      an attenuator operably connected to the first low-pass filter and the microprocessor, the attenuator configured to attenuate a strength value of the first low frequency-band signal to a value close to the predetermined attenuated strength value based on the period attenuated values; and
      a first rectifier filter operably connected to the first low-pass filter and the attenuator, the first rectifier filter configured to convert the first low frequency-band signal into a DC control signal and transmitting the DC control signal to a proportional valve, the proportional valve configured to adjust an opening ratio based on the DC control signal to produce a dynamic flame.

9. The flow control signal generation device for generating a DC control signal based on an audio signal of claim 8, further comprising a second low-pass filter electrically connected to the attenuator and configured to receive and filter the first low frequency-band signal to generate a second low frequency-band signal, a frequency of the second low frequency-band signal being under a second frequency which is smaller than the first frequency, wherein the first rectifier filter is operably connected to the second low-pass filter and is configured to convert the second low frequency-band signal into the DC control signal.

10. The flow control signal generation device for generating a DC control signal based on an audio signal of claim 8, wherein the filter rectifier module comprises:
a high-pass filter electrically connected to the audio receiving module and configured to receive and filter the audio signal to generate a first high frequency-band signal, a frequency of the first high frequency-band signal being above a third frequency; and
at least a rectifier filter unit electrically connected to the high-pass filter and the microprocessor and configured to convert the first high frequency-band signal into at least one DC audio signal, and transmit the at least one DC audio signal to the microprocessor.

11. The flow control signal generation device for generating a DC control signal based on an audio signal of claim 10, wherein the filter rectifier module further comprises a first signal amplifier, located between the high-pass filter and the at least one rectifier filter unit, the first signal amplifier configured to amplify a strength of the first high frequency-band signal.

12. The flow control signal generation device for generating a DC control signal based on an audio signal of claim 11, wherein the at least one rectifier filter unit comprises:
a second rectifier filter, electrically connected to the first signal amplifier, and configured to receive the first high frequency-band signal; and
a second signal amplifier, electrically connected between the second rectifier filter and the microprocessor, the second signal amplifier configured to amplify a strength of the regulated first high frequency-band signal and transmit the regulated first high frequency-band signal to the microprocessor.

13. The flow control signal generation device for generating a DC control signal based on an audio signal of claim 11, wherein the at least one rectifier filter unit comprises:
a third low-pass filter electrically connected to the first signal amplifier and configured to receive and filter the first high frequency-band signal to limit a frequency of the first high frequency-band signal under a fourth frequency; and
a third rectifier filter, electrically connected to the third low-pass filter and the microprocessor, the third rectifier filter configured to regulate the filtered first high frequency-band signal with the frequency thereof under the fourth frequency.

14. The flow control signal generation device for generating a DC control signal based on an audio signal of claim 11, wherein the at least one rectifier filter unit comprises:
a band pass filter electrically connected to the first signal amplifier and configured to receive and filter the first high frequency-band signal to limit a frequency of the first high frequency-band signal within a frequency range; and
a fourth rectifier filter, electrically connected to the band pass filter and the microprocessor, the fourth rectifier filter configured to regulate the filtered first high frequency-band signal with the frequency thereof limited in the frequency range.

15. A flow control apparatus, comprising:
a flow control signal generation device for generating a DC control signal based on an audio signal, comprising:
an audio receiving module configured to receive an audio signal;
a filter rectifier module electrically connected to the audio receiving module and configured to filter the audio signal to generate at least one DC audio signal;
a microprocessor electrically connected to the filter rectifier module and configured to analyze a strength of the at least one DC audio signal within a plurality of time periods to generate a plurality of period strength values, and compare the period strength values and a predetermined attenuated strength value to generate a plurality of period attenuated values; and
a proportional valve control signal generation module comprising:
a first low-pass filter electrically connected to the audio receiving module and configured to receive and filter the audio signal to generate a first low frequency-band signal, a frequency of the first low frequency-band signal being under a first frequency;
an attenuator electrically connected to the first low-pass filter and the microprocessor, the attenuator configured to attenuate a strength value of the first low frequency-band signal to a value close to the predetermined attenuated strength value based on the period attenuated values; and
a first rectifier filter electrically connected to the first low-pass filter and configured to convert the first low frequency-band signal into a DC control signal; and
at least a proportional valve, connected between a fluid supplier and at least one orifice and electrically connected to the proportional valve control signal generation module to receive the DC control signal, the at least one proportional valve configured to control a flow volume provided by the fluid supplier through the at least one proportional valve to the at least one orifice based on the DC control signal to produce a dynamic flame.

16. The flow control apparatus of claim 15, wherein the proportional valve control signal generation module further comprises:
a second low-pass filter electrically connected to the attenuator and configured to receive and filter the first low frequency-band signal and generate a second low frequency-band signal, a frequency of the second low frequency-band signal being under a second frequency which is smaller than the first frequency; and
a signal amplifier electrically connected to the second low-pass filter and configured to amplify the second low frequency-band signal,
wherein the first rectifier filter is operably connected to the signal amplifier and is configured to convert the second low frequency-band signal into the DC control signal.

17. The flow control apparatus of claim 15, wherein the filter rectifier module comprises:
a high-pass filter electrically connected to the audio receiving module and configured to receive and filter the volume control signal to generate a first high frequency-band signal, a frequency of the first high frequency-band signal being above a third frequency; and a rectifier filter unit, electrically connected to the high-pass filter and the microprocessor, the rectifier unit configured to convert the first high frequency-band signal into at least one DC audio signal, and transmit the at least one DC audio signal to the microprocessor.

18. The flow control apparatus of claim 17, wherein the filter rectifier module further comprises a first signal amplifier, located between the high-pass filter and the at least one rectifier filter unit, the first signal amplifier configured to amplify a strength of the first high frequency-band signal.

19. The flow control apparatus of claim 18, wherein the at least one rectifier filter unit comprises:
 a second rectifier filter, electrically connected to the first signal amplifier, and configured to receive the first high frequency-band signal; and
 a second signal amplifier, electrically connected between the second rectifier filter and the microprocessor, the second signal amplifier configured to amplify a strength of the regulated first high frequency-band signal and transmit the regulated first high frequency-band signal to the microprocessor.

20. The flow control apparatus of claim 18, wherein the at least one rectifier filter unit comprises:
 a third low-pass filter electrically connected to the first signal amplifier and configured to receive and filter the first high frequency-band signal to limit a frequency of the first high frequency-band signal under a fourth frequency; and
 a third rectifier filter, electrically connected to the third low-pass filter and the microprocessor, the third rectifier filter configured to regulate the filtered first high frequency-band signal with the frequency thereof under the fourth frequency.

21. The flow control apparatus of claim 18, wherein the at least one rectifier filter unit comprises:
 a band pass filter electrically connected to the first signal amplifier and configured to receive and filter the first high frequency-band signal to limit a frequency of the first high frequency-band signal within a frequency range; and
 a fourth rectifier filter, electrically connected to the band pass filter and the microprocessor, the fourth rectifier filter configured to regulate the filtered first high frequency-band signal with the frequency thereof limited in the frequency range.

* * * * *